United States Patent
Clark et al.

(10) Patent No.: US 6,894,908 B1
(45) Date of Patent: May 17, 2005

(54) BRIDGE CLIP WITH BIMETALLIC LEAF AND METHOD

(75) Inventors: Bruno Clark, Chandler, AZ (US); Kyle W. Kippes, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 10/401,648

(22) Filed: Mar. 28, 2003

(51) Int. Cl.[7] ................................................ H02B 1/01
(52) U.S. Cl. ........................ 361/825; 439/73; 361/801
(58) Field of Search .................. 361/760, 796, 361/800–802, 807, 816, 818, 713, 751, 719; 257/707, 712, 717–720, 713; 439/73

(56) References Cited

U.S. PATENT DOCUMENTS

| | | | | |
|---|---|---|---|---|
| 5,367,253 A | * | 11/1994 | Wood et al. | 324/158.1 |
| 5,376,587 A | * | 12/1994 | Buchmann et al. | 438/122 |
| 5,541,525 A | * | 7/1996 | Wood et al. | 324/755 |
| 5,634,267 A | * | 6/1997 | Farnworth et al. | 29/840 |
| 6,040,702 A | * | 3/2000 | Hembree et al. | 324/755 |
| 6,436,223 B1 | * | 8/2002 | Edwards et al. | 156/288 |
| 6,442,026 B2 | | 8/2002 | Yamaoka | 361/704 |
| 6,462,952 B1 | | 10/2002 | Ubukata et al. | 361/719 |
| 6,545,352 B1 | * | 4/2003 | Ruckdeschel | 257/718 |

* cited by examiner

Primary Examiner—David Martin
Assistant Examiner—Thanh S Phan
(74) Attorney, Agent, or Firm—Schwegman, Lundberg, Woessner & Kluth, P.A.

(57) ABSTRACT

A bridge clip with a leaf holds an integrated heat spreader on a die during curing. The leaf may have at least two metal portions with different coefficients of thermal expansion (CTE) to exert a changing force on the heat spreader over temperature. The die may be coupled to the heat spreader with a polymer interface material which is cured at an elevated temperature. In embodiments in which the die is located off-center under the heat spreader, the clip may exert an off-center force on the heat spreader when curing at the elevated temperature due to the differing CTEs. In other embodiments, in which the die is located toward the center of the heat spreader, a leaf with two layers having different CTEs may help reduce variable contact geometry, which may be especially helpful in higher force situations.

15 Claims, 6 Drawing Sheets

Fig. 1

CARRIER W/PACKAGE AND BRIDGE CLIP

BRIDGE CLIP WITH BIMETALLIC LEAF AND METHOD

TECHNICAL FIELD

The present invention pertains to integrated circuit package manufacturing, and in embodiments, to bridge clips used to retain heat spreader lids on a substrate during assembly processes.

BACKGROUND

Manufacture of integrated circuit packages may involve, among other processes, the installation of heat spreaders onto the package. During an installation process, a heat spreader lid may be adhered to a substrate while the package is mounted in a process carrier. The lid may be affixed to the substrate using an adhesive and an interface material may be applied between the die and the heat spreader. Thermal conductivity between the heat spreader and the die may be dependent on the application force on the lid during curing of the interface material. A bridge clip is typically used to secure the package in the process carrier and apply force to the heat spreader while the adhesive and interface material is cured. To ensure proper heat transfer from the substrate to the heat spreader, the force asserted by the bridge clip should be maintained within an appropriate range. Examples of bridge clips may be referenced in United States Patent Application entitled "BRIDGE CLIP WITH REINFORCED STIFFENER", having application Ser. No. 10/262,407, filed Sep. 30, 2002 and assigned to same assignee as the present application.

In some packaging situations, instead of the die being located near the center of the substrate, the die may be mounted off-center. One problem is that for these off-center located die, additional force may be desirable toward the side of the heat spreader with the die because the interface material may expand when curing at an elevated temperature. Conventional bridge clips may apply a more centralized force resulting in possible deformation of the heat spreader and reduced thermal conductivity between the heat spreader and the off-center die.

In some other packaging situations, a higher force may be needed to hold the heat spreader in place during curing. The use of higher force bridge clips generally provide a less uniform force reducing the thermal conductivity for center located die. Furthermore, the use of higher force bridge clips may deform the heat spreader, especially when curing the interface material at an elevated temperature.

Thus there is a general need for an improved bridge clip and method for holding a package in a carrier during curing. What is also needed is a bridge clip and method for securing a heat spreader over an off-center die. What is also needed is a bridge clip and method that provides an off-center force on a heat spreader when curing at an elevated temperature. What is also needed is a bridge clip and method that provides a more uniform force on a heat spreader. What is also needed is a bridge clip and method that may reduce the deformation of the heat spreader when curing at an elevated temperature.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the full ambit of the claims and all available equivalents.

The present invention provides an improved bridge clip and method for holding a package in place in a carrier during curing. In embodiments, the present invention provides a bridge clip and method for securing a heat spreader over an off-center die. In embodiments, the present invention also provides a bridge clip and method that provides an off-center force on a heat spreader when curing at an elevated temperature. In embodiments, the present invention also provides a bridge clip and method that provides a more uniform force on a heat spreader. In embodiments, the present invention also provides a bridge clip and method that may reduce the deformation of the heat spreader when curing at an elevated temperature.

In embodiments, the leaf may have first and second metal portions with different coefficients of thermal expansion (CTEs) to exert a changing force on the heat spreader over temperature. The die may be coupled to the heat spreader with a polymer interface material which is cured at an elevated temperature. In embodiments in which the die is located off-center under the heat spreader, the clip may exert an off-center force on the heat spreader when curing at an elevated temperature due to the differing CTEs. In other embodiments, in which the die may be located toward the center of the heat spreader, a leaf with two layers, each having a different CTE, may help reduce variable contact geometry during curing at an elevated temperature. This may be especially helpful in higher force situations.

Figure 1:
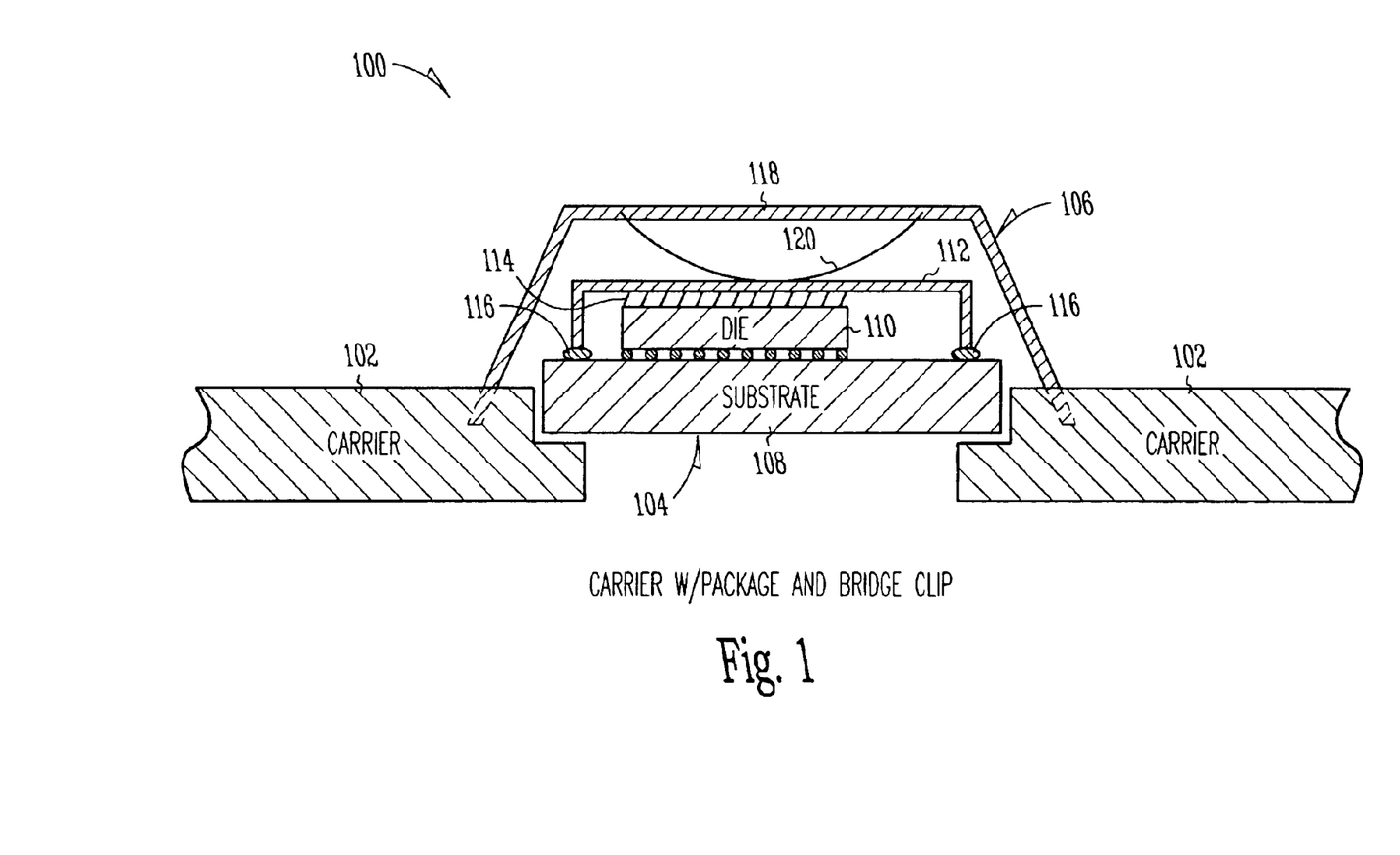
FIG. 1 illustrates a system which includes a carrier with a package and bridge clip in accordance with embodiments of the present invention.

FIG. 1 illustrates a system that includes a carrier with a package and bridge clip in accordance with embodiments of the present invention. System 100 may be an assembly that includes process carrier 102 which supports package 104.

Package 104 may include substrate 108, die 110 and heat spreader 112. Heat spreader 112 may be thermally coupled to die 110 with interface material 114. Interface material 114 provides thermal conductivity and is disposed between die 110 and heat spreader 112. Heat spreader 112, may be viewed as a lid, which may be adhered to substrate 108 with sealant 116 which may surround die 110 to seal the region between die 110 and heat spreader 112. Die 110 may be mounted to the surface of substrate 108 by almost any surface mounting technique.

In embodiments, interface material 114 may be a polymer interface material and may be cured at an elevated temperature. During the curing process, a clip, such as bridge clip 106, may be used to secure package 104 in process carrier 102. Once heat spreader 112 is in place, bridge clip 106 may be fastened to the process carrier to hold package 104 in place in process carrier 102 to maintain an appropriate force on the heat spreader 112 while interface material 114 and/or sealant 116 are being cured. To ensure proper heat transfer from substrate 108 to heat spreader 112, the force asserted by bridge clip 106 onto the heat spreader 112 may be maintained within an appropriate range. Bridge clip 106 may include bridge portion 118 and leaf 120. Leaf 120 may apply a force to heat spreader 112. Bridge portion 118 may clip into retention slots (not illustrated) of carrier 102 to secure package 104 in position.

In accordance with embodiments of the present invention, leaf 120 may comprise metal portions having different coefficients of thermal expansion allowing the force applied by bridge clip 106 to change with temperature. In some embodiments, when die 110 may be located off-center under heat spreader 112 (as illustrated in FIG. 1), bridge clip 106 may apply a force which may increase in the direction of die 110 when curing at an elevated temperature as a result of the leaf composition. In other embodiments, when die is located toward the center under heat spreader 112, bridge clip may apply a more uniform force to the heat spreader when curing at an elevated temperature as a result of the leaf composition. These embodiments are described in more detail below.

Interface material 114 and sealant 116 may be cured at a temperature elevated above room temperature, which may range, for example, from 100 to 180 degrees Celsius. Substrate 108 may be an organic substrate, such as FR4 or FR5, or may be a ceramic substrate. Sealant 116 may be an epoxy adhesive that may or may not require curing at an elevated temperature. Examples of suitable material for use as interface material 114 include thermal setting polymers, thermal setting polymer matrix with aluminum fillers, thermal setting polymer/solid hybrids, and solder interface materials, such as SnAg.

Figure 2A:
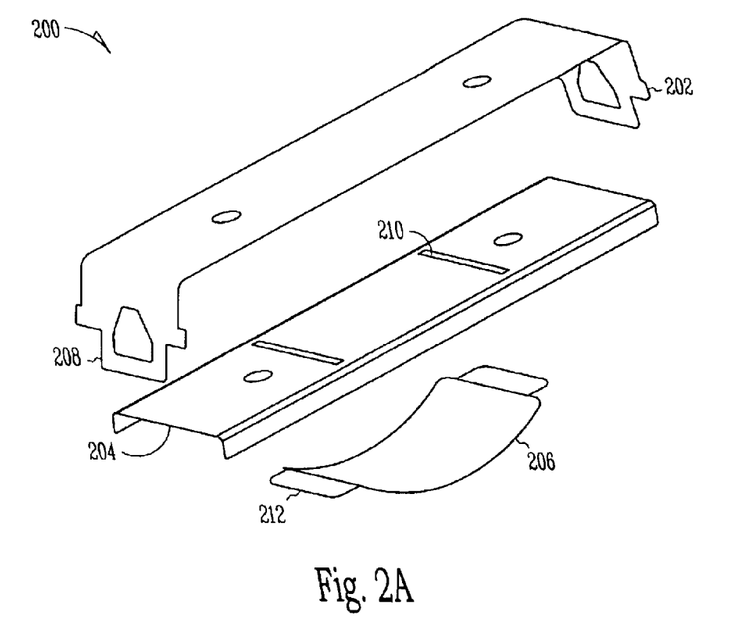
FIGS. 2A and 2B illustrate bridge clips in accordance with embodiments of the present invention.
Figure 2B:
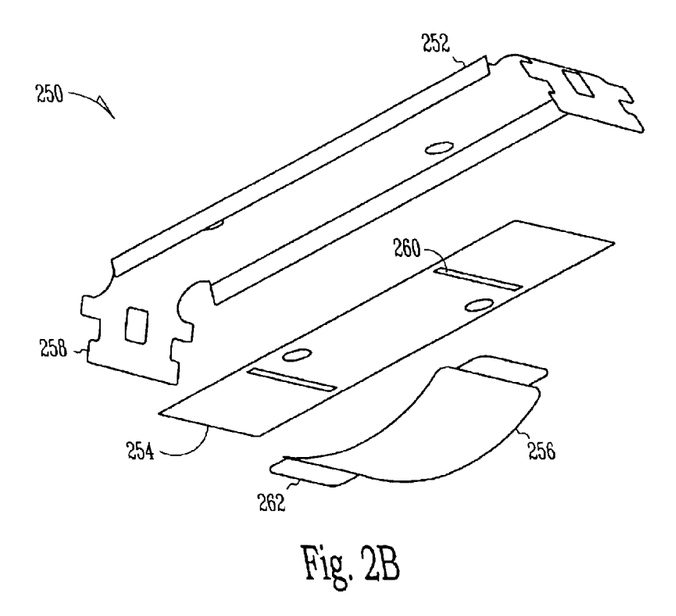

FIGS. 2A and 2B illustrate bridge clips in accordance with embodiments of the present invention. Bridge clips 200 and 250 may be suitable for use as bridge clip 106 (FIG. 1), although other bridge clip configurations may also be suitable. Referring to FIG. 2A, bridge clip 200 may include bridge portion 202, stiffener 204 and leaf 206. Tabs 208 of bridge portion 202 may engage with retention slots of carrier 102 (FIG. 1). Tabs 212 of leaf may be inserted into slots 210 of stiffener 204 to retain leaf 206. Referring to FIG. 2B, bridge clip 250 may include bridge portion 252, stiffener 254 and leaf 256. Tabs 258 of bridge portion 252 may engage with retention slots of carrier 102 (FIG. 1). Tabs 262 of leaf 256 may be inserted into slots 260 of stiffener 254 to retain leaf 256.

Figure 3:
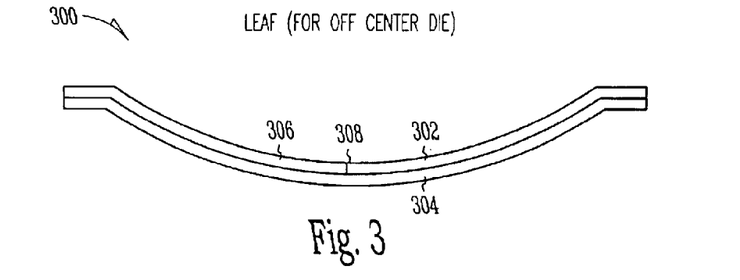
FIG. 3 illustrates a leaf for a bridge clip in accordance with embodiments of the present invention.

FIG. 3 illustrates a leaf for a bridge clip in accordance with embodiments of the present invention. Leaf 300 may be suitable for use as leaf 120 (FIG. 1), leaf 206 (FIG. 2A) and leaf 256 (FIG. 2B) although other leaf configurations may also be suitable. In embodiments, leaf 300 may include a metal portion 302 and base metal portion 304. Metal portions 302 AND 304 may have different coefficients of thermal expansion (CTEs) allowing leaf 300 to apply an off-center force to a heat spreader with changes in temperature. In one embodiment, metal portion 302 may be bonded to base metal portion 304. In other embodiments, leaf 300 may include one or more additional metal portions 306 which may have different CTEs from the other metal portions further contributing the off-center force that leaf 300 may apply over temperature. In some of these embodiments, metal portion 302 may have a higher CTE than base metal portion 304, while in other of these embodiments, metal portion 302 may have a lower CTE than base metal portion 304. In embodiments that include metal portion 306, metal portion 306 may have higher CTE than base metal portion 304 when metal portion 302 has a lower CTE that base metal portion 304. In addition, in embodiments that include metal portion 306, metal portion 306 may have lower CTE than base metal portion 304 when metal portion 302 has a higher CTE that base metal portion 304. The selection of materials for use as the metal portions allow a force provided by leaf 300 to selectively shift either to the left or right (as illustrated in FIG. 3) over temperature providing additional force on a heat spreader for an off-center die.

Examples of suitable material for base metal portion 304 includes stainless steel, such as stainless steel #303, #304, #316 and #403, which may be heat treated. Examples of suitable material from metal portions 302 and 306 may include various combinations of stainless steel, aluminum and copper, including for example, stainless steel #403, aluminum 2024-T2, aluminum 2024-T, aluminum 3003, aluminum 5052, aluminum 6061-0, aluminum 6061-T4, copper C110-hard, and copper C110-Soft. Although the embodiments illustrated in FIG. 3 show base metal portion 304 on the convex side of leaf 300, this is not a requirement. In other embodiments, base metal portion 304 may be on the concave side of leaf 300.

In embodiments, metal portions 302 and/or 306 may be deposited on base metal portion 304, while in other embodiments, metal portions 302 and/or 306 may be adhered and/or welded to base metal portion 304. Localized tack welding in neutral or pre-stressed conditions for similar metals in conjunction with, or in place of chemical adhesion of dissimilar metals may be used, and may help provide a corrosion barrier during high humidity conditions.

In alternative embodiments, leaf 300 may include metal portions 302 and 306 without the inclusion of base metal portion 304. In these alternative embodiments, metal portions 302 and 306 may be bonded, adhered to, welded together at location 308, which may be at the center of leaf 300.

FIGS. 4A, 4B, 4C and 4D illustrate compression of a leaf at various process points in accordance with embodiments of the present invention. FIGS. 4A, 4B, 4C and 4D also illustrate the forces applied to heat spreader 401 at some of various process points of installing a bridge clip and curing the interface material. Leaf 300 (FIG. 3) may be suitable for use as leaf 400 although other leaf configurations may also be suitable. Leaf 400 is illustrated at various process points 402–408.

Figure 4A:
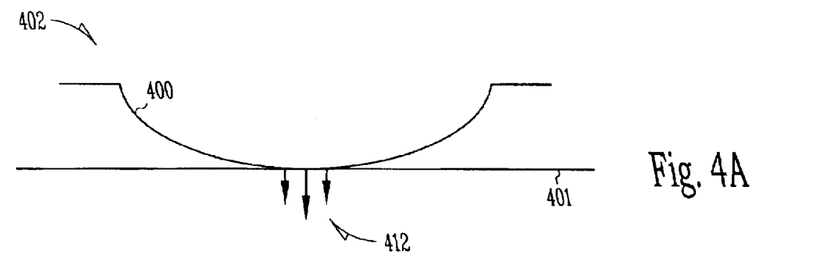
FIGS. 4A, 4B, 4C and 4D illustrate compression of a leaf at various process points in accordance with embodiments of the present invention.

Process point 402 illustrates leaf 400 in an initial position before the bridge clip is clipped into the retaining slots of the carrier. At process point 402, leaf 400 provides virtually no force on heat spreader 401, illustrated by force vectors 412.

Figure 4B:
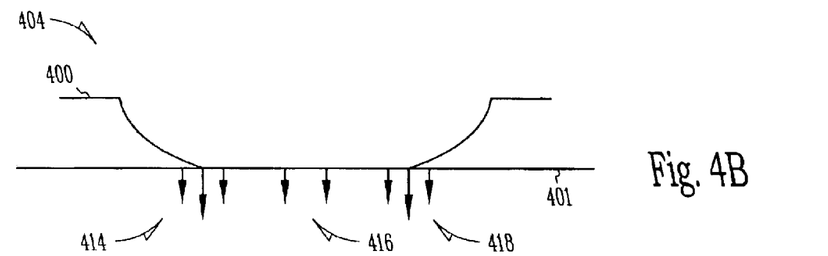

At process point 404, the bridge clip may be clipped into the retaining slots of the carrier and may provide a somewhat uniformly distributed force on heat spreader 401 illustrated by force vectors 414, 416 and 418. In some cases, force vectors 414 and 418 toward the outside may be greater than the force vectors 416 at the center, however force vectors 414 and 418 may be approximately the same (e.g., when at room temperature).

Figure 4C:
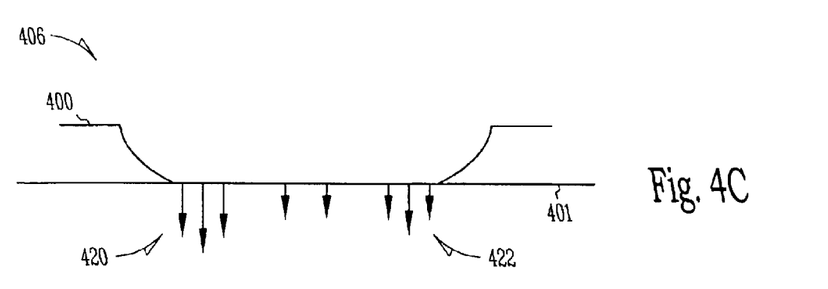

Process point 406 may be at a cure temperature, which may be an elevated temperature. At process point 406, leaf 400 may provide a force on the heat spreader shifted toward one side (e.g., a side with a die) as illustrated by force vectors 420 being greater than force vectors 422. The greater force on one side is due to the metal portions of heat spreader 400 having different CTEs. In this example, a metal portion on the left side may have a greater CTE than a metal portion on the right side. Leaf 400 may provide up to 10 to 12 pounds of force during process point 406.

Figure 4D:
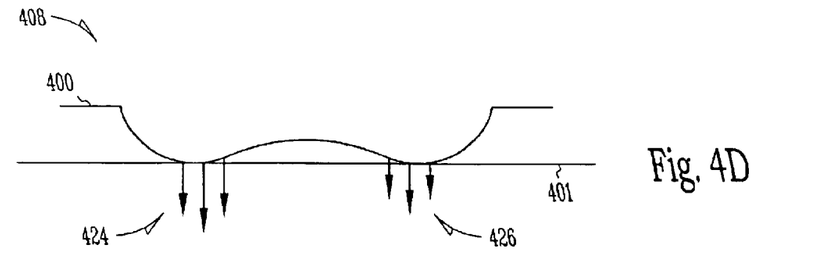

Process point 408 illustrates a situation when leaf 400 may deform. This deformation may sometimes occur upon initial latching of the bridge into retention slots of a carrier during assembly. This deformation may also sometimes occur at an elevated temperature. Similar to process point 406, leaf 400 may provide a force of heat spreader 401 that is shifted toward one side as illustrated by force vectors 424 being greater than force vectors 426, however due to the deformation of leaf 400 at process point 408, force vectors 424 and 426 may be less that force vectors 420 and 422, respectively. In addition, due to the deformation of leaf 400 at process point 408, no force is applied at the center of the heat spreader.

As can be seen, a bridge clip having a leaf in accordance with the embodiments illustrated in FIG. 3, may provide an off-center force at an elevated temperature which may be suitable for curing interface material for an off-center die under a heat spreader.

Figure 5:
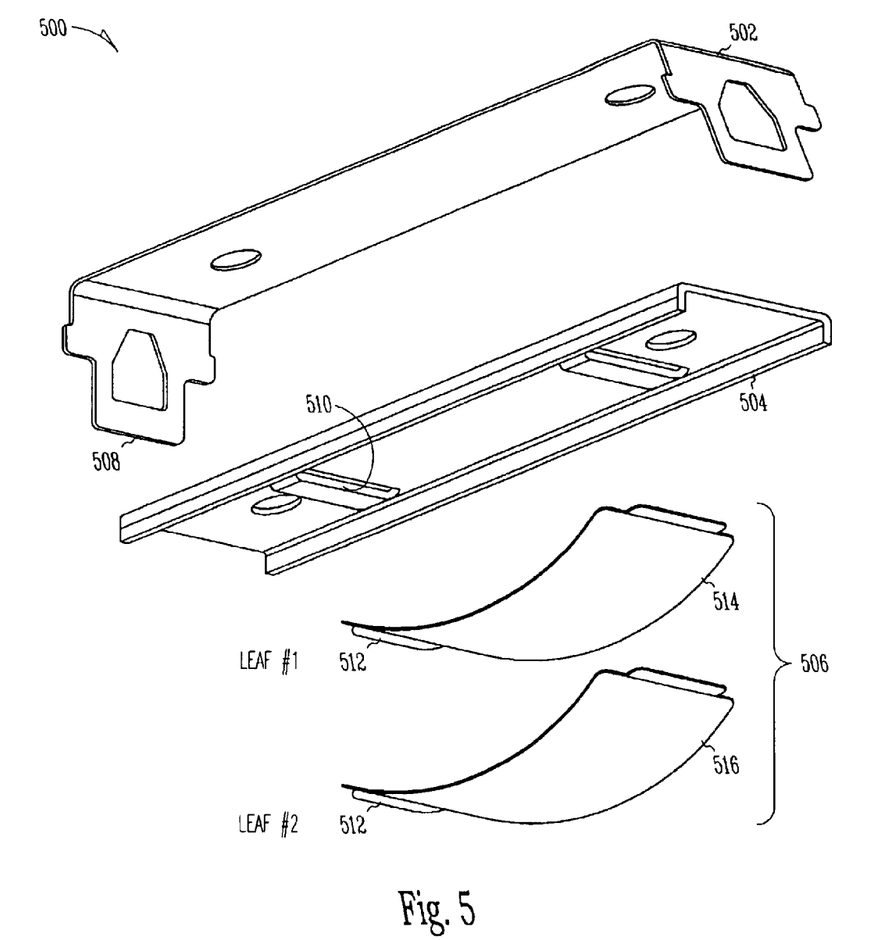
FIG. 5 illustrates a bridge clip with a two-layer leaf in accordance with embodiments of the present invention.

FIG. 5 illustrates a bridge clip with two-layer leaf in accordance with embodiments of the present invention. Bridge clip 500 may include bridge portion 502, stiffener 504 and leaf 506. Tabs 508 of bridge portion 502 may engage with retention slots of carrier 102 (FIG. 1). Tabs 512 of leaf 506 may be inserted into slots 510 of stiffener 504 to retain leaf 506. Bridge clip 500 may be similar to bridge clip 200 (FIG. 2A) as illustrated, or similar to bridge clip 250 (FIG. 2B), although other bridge clip configurations are also suitable.

Leaf 506 may be comprised of first and second portions 514 and 516, which may be separate leafs of materials having different coefficients of thermal expansion (CTEs). For example, in one embodiment, leaf portion 514 may have a greater CTE than leaf portion 516, while in other embodiment, leaf portion 514 may have a lower CTE than leaf portion 516. This may allow leaf 506 to provide a more uniform force on a heat spreader over temperature. This is described in more detail below.

Figure 6:
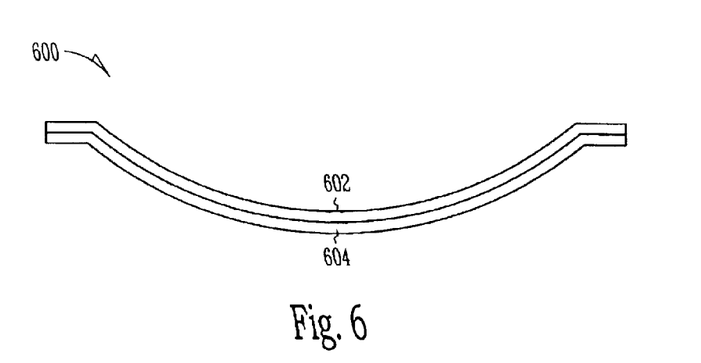
FIG. 6 illustrates a leaf for a bridge clip in accordance with other embodiments of the present invention.

FIG. 6 illustrates a leaf for a bridge clip in accordance with other embodiments of the present invention. Leaf 600 may be suitable for use as leaf 506 (FIG. 5) and includes first and second portions 602 and 604 corresponding respectively with first and second portions 514 and 516 (FIG. 5). In embodiments, portion 602 may be comprised of a metal, such as one of the metals described for portion 302 (FIG. 3), while portion 604 may be comprised of a metal such as one of the metals described for portion 304 (FIG. 3). In one embodiment, portions 602 and 604 may be separate leafs, while in other embodiments, portions 602 and 604 may constitute a single leaf with different metal portions. Portions 602 and 604 may be adhered or welded together. In one embodiment, portion 604 is a base layer and portion 602 may be deposited or plated onto portion 604. Localized tack welding in neutral or pre-stressed conditions for similar metals in conjunction with, or in place of chemical adhesion of dissimilar metals may be used, and may help provide a corrosion barrier during high humidity conditions.

Figure 7A:
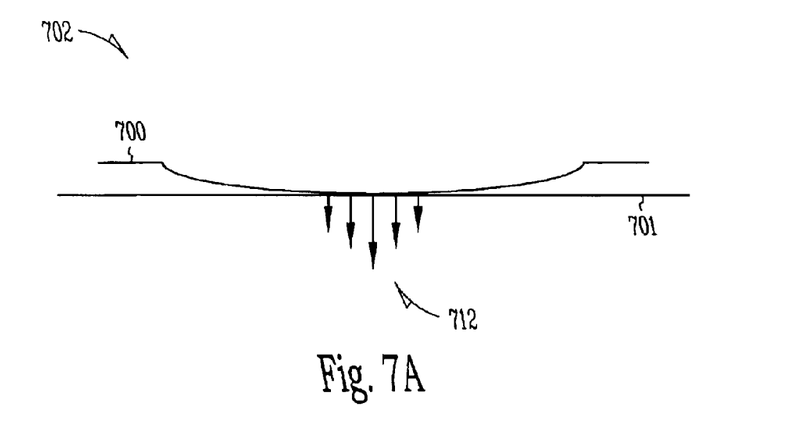
FIGS. 7A, 7B and 7C illustrate compression of a leaf at various process points in accordance with embodiments of the present invention.
Figure 7B:
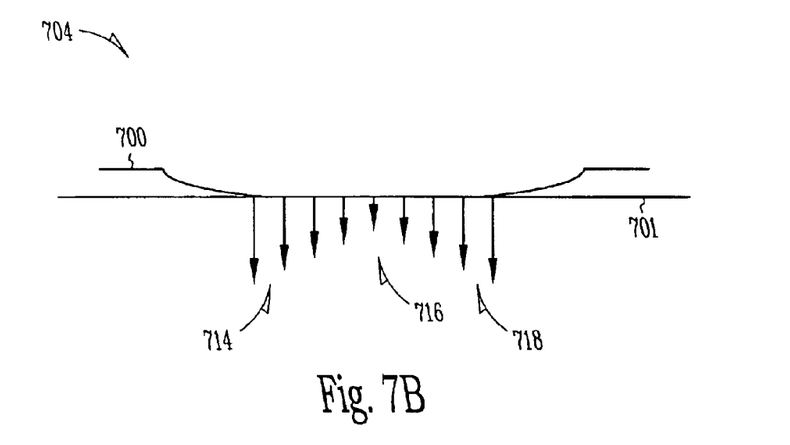
Figure 7C:
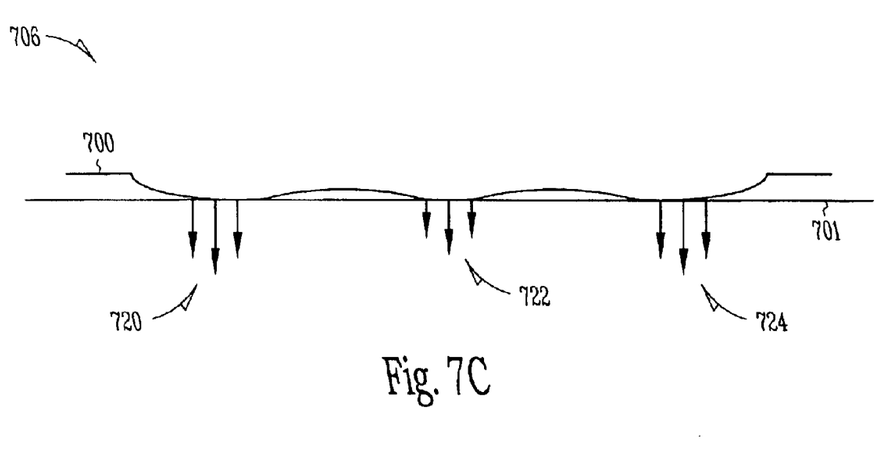

FIGS. 7A, 7B and 7C illustrate compression of leaf 700 at various process points in accordance with embodiments of the present invention. FIGS. 7A, 7B and 7C also illustrate the forces applied to heat spreader 701 at some of various process points of installing a bridge clip and curing the interface material. Leaf 600 (FIG. 6) may be suitable for use as leaf 700 although other leaf configurations may also be suitable. Leaf 700 is illustrated at various process points 702–706. As compared to the forces exhibited by leaf 400 illustrated in FIGS. 4A–4D, leaf 700 may be compressed more and may exert a higher force on the heat spreader. For example, two-layer leaf 700 may provide up to 16 pounds or more of force on heat spreader 701.

Process point 702 illustrates leaf 700 in an initial position before the bridge clip is clipped into the retaining slots of the carrier. At process point 702, leaf 700 provides very little force on heat spreader 701 illustrated by force vectors 712. At process point 704, the bridge clip may be clipped into the retaining slots of the carrier and may provide a somewhat uniformly distributed force on heat spreader 701 illustrated by force vectors 714, 716 and 718. In some cases, the force vectors 714 and 718 toward the outside may be greater than the force vectors 716 at the center, however force vectors 714 and 718 may be approximately the same, regardless of temperature.

At process point 706, leaf 700 may deform due to temperature or increased compression force and may provide forces on heat spreader 701 illustrated by force vectors 720, 722 and 724. If leaf 700 were comprised of a single material, at an elevated temperature, force vectors 722 may be significantly less than force vectors 720 and 722. However, when a two-layer leaf, such as leaf 600 (FIG. 6) is used for leaf 700, force vectors 722 may increase with respect to force vectors 720 and 724 providing a more uniformly distributed force on heat spreader 701 as illustrated at process point 706. Accordingly, less deformation of the heat spreader may occur and lower-force leafs may be used.

Figure 8:
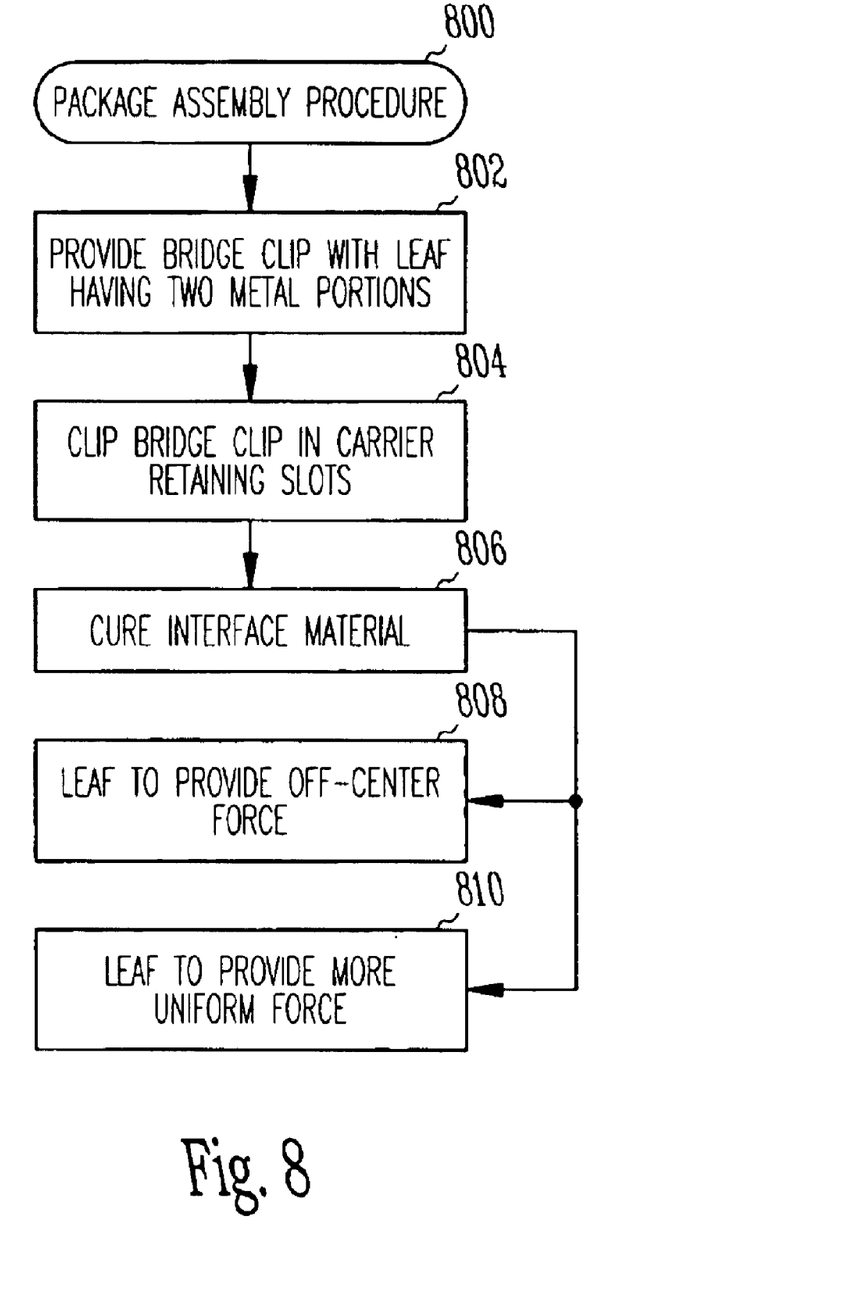
FIG. 8 is a flow chart of a method in accordance with embodiments of the present invention.

FIG. 8 is a flow chart of a method in accordance with embodiments of the present invention. Procedure 800 may be used to hold or secure a package in a carrier during assembly processes that may include curing interface material that is located between a die and a heat spreader. Procedure 800, for example, may be suitable for use with package 104 (FIG. 1) and carrier 102 (FIG. 1) although other systems may also be suitable for use with procedure 800. Procedure 800 may be suitable for use for packages having off-center located die, as well as for packages requiring higher forces on a heat spreader during curing.

In operation 802, a bridge clip is provided. The bridge clip may have a bridge and a leaf coupled to the bridge. The leaf may be comprised of first and second metal portions having different coefficients of thermal expansion (CTE). Examples of suitable leafs may include leaf 300 (FIG. 3) of leaf 600 (FIG. 6).

In operation 804, the bridge clip may be clipped into retaining slots of a carrier to hold the heat spreader in position on a substrate over a die. The interface material couples the die to the heat spreader and a sealant may seal the heat spreader to the substrate.

In operation 806, the interface material may be cured. As part of operation 806, the package, as held to the carrier with the bridge clip, may be raised to an elevated temperature. As part of operation the leaf to exert a changing force on the heat spreader at the elevated temperature. Operation 806 may also cure the sealant.

Operation 808 may be performed for embodiments when the die is located on the substrate toward one side of the heat spreader. In these embodiments, first and second metal portions of the clip are selected to provide an increased force on the one side of the heat spreader during curing of the interface material at an elevated temperature. Accordingly, when raising the package to an elevated temperature, the leaf may exert an off-center force on the heat spreader at the elevated temperature more suitable for off-center located die.

Operation 810 may be performed when the die is located toward the center and a two-layer leaf may be used. In these embodiments, the first layer of the leaf may have a greater CTE than the second layer and the second layer may contact the heat spreader. When the package is raised to an elevated temperature, a central portion of the leaf may provide increased force on the heat spreader. Accordingly, deformation of the heat spreader may be reduced.

Although the individual operations of procedure 800 are illustrated and described as separate operations, one or more of the individual operations may be performed concurrently and nothing requires that the operations be performed in the order illustrated.

Thus, improved bridge clips and methods for holding package during curing in a carrier have been described. The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the enclosed embodiments. The phraseology or terminology employed herein is for the purpose of description and not of limitation. Accordingly, the invention embraces all such alternatives, modifications, equivalents and variations as fall within the spirit and scope of the appended claims.

What is claimed is:

1. A bridge clip comprising:
   a bridge; and
   a leaf to couple to the bridge and to exert an off-center force on a heat spreader, the leaf comprising first and second layers, the first layer having first and second metal portions with differing coefficients of thermal expansion (CTE) to exert a substantially centralized force on the heat spreader at a room temperature and the off-center force at an elevated temperature.

2. The bridge clip of claim 1, where the bridge clip holds the heat spreader over an off-center die, and wherein the leaf exerts an off-center force on the heat spreader toward the off-center die at the elevated temperature.

3. The clip of claim 2 wherein a polymer interface material (PIM) thermally couples the off-center die to the heat spreader, the PIM being to be cured at the elevated temperature.

4. The clip of claim 3 wherein the off-center die is located on a substrate toward one side of the heat spreader, and wherein the first and second metal portions of the first layer of the leaf are selected to provide an increased force on the one side of the heat spreader at least at the elevated temperature.

5. The clip of claim 4 wherein the leaf has first and second ends that attach to the bridge and meet at a central location, and wherein the second layer in part contacts the heat spreader, and wherein the first metal portion extends from the first end to the central location, and the second metal portion extends from the second end to at least the central location, and
   wherein the first and second metal portions of the first layer are bonded together the central location of the first layer.

6. The clip of claim 5 wherein the first metal portion has a greater coefficient of thermal expansion than the second metal portion,
   wherein the off-center die is located toward the first end, and
   wherein the leaf exerts a greater force toward the first end at the elevated temperature than toward the second end at the elevated temperature.

7. The clip of claim 6 wherein the second layer is a base metal layer extending between the ends of the leaf, and wherein the first layer, including the first and second metal portions, is disposed over the base metal layer.

8. The clip of claim 7 wherein the first and second metal portions of the first layer of the leaf are bonded to the base metal layer, and
   wherein the base metal layer comprises a stainless steel and at least the first metal portion of the first layer has a greater coefficient of thermal expansion than the base metal layer.

9. The clip of claim 5 wherein the bridge clips into a carrier which supports a substrate upon which the off-center die is mounted, and
   wherein the heat spreader is adhered to the substrate with a sealant, and wherein curing at the elevated temperature cures the sealant and the polymer interface material.

10. A method comprising:
    providing a bridge clip having a bridge and a leaf coupled to the bridge, the leaf comprising first and second layers, the first layer having first and second metal portions with differing coefficients of thermal expansion (CTE);
    clipping the bridge clip into retaining slots of a carrier to secure a heat spreader in position on a substrate over an off-center die, the off-center die, the substrate and the heat spreader comprising a package, wherein an interface material couples the off-center die to the heat spreader, and wherein a sealant couples the heat spreader to the substrate; and
    raising an assembly to an elevated temperature to cure the interface material, the leaf to exert an off-center force on the heat spreader toward the die at the elevated temperature and a substantially centralized force on the heat spreader at a room temperature, the bridge clip, carrier and package comprising the assembly.

11. The method of claim 10 wherein the off-center die is located on the substrate toward one side of the heat spreader,
    wherein the first and second metal portions of the first layer of the leaf are selected to provide an increased force on the one side of the heat spreader at the elevated temperature, and
    wherein when raising the assembly to the elevated temperature, the first and second metal portions of the first layer of the leaf exert the off-center force on the heat spreader at the elevated temperature.

12. The method of claim 10 wherein the first metal portion has a greater CTE than the second metal portion, and wherein the second layer of the leaf is to contact the heat spreader, and wherein the first and second metal portions of the first layer are bonded at a central location of the first layer, and wherein the first metal portion extends from a first end of the leaf to the central location, and wherein the second metal portion extends from a second end of the leaf to the central location.

13. An assembly comprising:

a process carrier;

a package comprising a substrate, an off-center die and thermal interface material bonding the off-center die to a heat spreader; and a bridge clip clipped into retaining slots of the carrier to secure the heat spreader in position on the substrate, the bridge clip having a bridge and a leaf coupled to the bridge, the leaf comprising first and second layers, wherein the first layer has first and second metal portions with differing coefficients of thermal expansion (CTE) to exert an off-center force on the heat spreader at an elevated temperature.

14. The assembly of claim 13 wherein the off-center die is located on the substrate toward one side of the heat spreader, the first and second metal portions of the first layer of the leaf to provide an increased force on the one side of the heat spreader at the elevated temperature.

15. The assembly of claim 13 wherein the first metal portion has a greater CTE than the second metal portion, wherein the second layer is to contact the heat spreader, and wherein the first and second metal portions of the first layer are bonded together at central location of the first layer, and wherein the first metal portion extends from a first end of the leaf to the central location, and wherein the second metal portion extends from a second end of the leaf to the central location.

* * * * *

UNITED STATES PATENT AND TRADEMARK OFFICE
CERTIFICATE OF CORRECTION

PATENT NO. : 6,894,908 B1  
DATED : May 17, 2005  
INVENTOR(S) : Clark et al.

Page 1 of 1

It is certified that error appears in the above-identified patent and that said Letters Patent is hereby corrected as shown below:

Column 7,
Line 60, after "PIM" delete "being".

Signed and Sealed this

Twenty-third Day of August, 2005

JON W. DUDAS
*Director of the United States Patent and Trademark Office*